United States Patent

Van Iperen et al.

[15] 3,701,049

[45] Oct. 24, 1972

[54] MICROWAVE OSCILLATOR EMPLOYING A CAVITY RESONATOR HAVING DIELECTRIC WALLS USED AS A QUARTER WAVE IMPEDANCE TRANSFORMER

[72] Inventors: Bernardus Bastiaan Van Iperen; Hindrik Tjassens, both of Emmasingel, Eindhoven, Netherlands

[73] Assignee: U.S. Philips Corporation, New York, N.Y.

[22] Filed: Oct. 21, 1970

[21] Appl. No.: 82,766

[30] Foreign Application Priority Data

Oct. 25, 1969 Netherlands..............6916126

[52] U.S. Cl.........331/107 R, 317/234 R, 317/234 G, 331/96, 331/101, 333/12

[51] Int. Cl.............................H03b 5/12, H03b 5/24

[58] Field of Search........317/234, 235, 4, 4.1, 5, 5.4, 317/25, 25.1, 47.1; 307/322, 323, 252; 331/107, 101, 96; 333/7, 8, 12

[56] References Cited

UNITED STATES PATENTS

| | | | |
|---|---|---|---|
| 3,320,497 | 5/1967 | Neuf | 317/234 |
| 3,402,361 | 9/1968 | Havens | 317/234 |
| 3,418,587 | 12/1968 | Riebman et al. | 317/235 |
| 3,452,255 | 6/1969 | Neale et al. | 317/234 |
| 3,533,855 | 10/1970 | Lederman et al. | 317/234 |
| 3,544,859 | 12/1970 | Tijburg et al. | 317/234 |
| 3,553,610 | 1/1971 | Brenner et al. | 317/234 |

FOREIGN PATENTS OR APPLICATIONS

| | | | |
|---|---|---|---|
| 1,212,638 | 3/1966 | Germany | 317/234 |

*Primary Examiner*—John W. Huckert
*Assistant Examiner*—Andrew J. James
*Attorney*—Frank R. Trifari

[57] ABSTRACT

A microwave oscillator comprising a semiconductor device employed in a cavity resonator having dielectric walls. The cavity is matched to external loads by utilizing the dielectric walls of the resonator as a quarter-wave impedance transformer.

7 Claims, 9 Drawing Figures

INVENTORS
BERNARDUS B. VAN IPEREN
HENDRIK TJASSENS

BY

AGENT

INVENTORS
BERNARDUS B. VAN IPEREN
HENDRIK TJASSENS
BY
AGENT

MICROWAVE OSCILLATOR EMPLOYING A CAVITY RESONATOR HAVING DIELECTRIC WALLS USED AS A QUARTER WAVE IMPEDANCE TRANSFORMER

The invention relates to a microwave device comprising a hollow spacing cylinder of dielectric material, closed at the head faces by electrically conductive contact members and a semiconductor diode arranged inside the cylinder and connected at one end directly to one of the contact members and at the other end via a supply wire to the other contact member.

Such a microwave device is known from "-Proceedings of the I.E.E.E.," Mar. 1969, pages 399 and 340.

In order to form an oscillator this device is arranged in a cavity resonator which is adapted to a load formed by a wave guide by means of an iris diaphragm.

This involves the problem of matching the semiconductor diode with the envelope thereof formed by the spacing cylinder and the contact members with the cavity resonator and of tuning the assembly to the desired oscillator frequency. A difficulty arises from the reactance of the spacing cylinder, which plays a role both in the matching and in the tuning conditions. It is therefore endeavored in the known semiconductor device to minimize the capacitance and the inductance of the envelope. With such a low capacitance and inductance of the spacing cylinder it is possible to match the diode and the cavity resonator in a simple manner and to cover a large tuning range by mechanical frequency tuning.

The invention has for its object to eliminate the capacitance and the inductance of the envelope as factors in the matching and tuning conditions by an extremely simple novel construction of the microwave device of the kind set forth, so that tuning to still higher frequencies and an even simpler matching are obtainable.

The microwave device according to the invention is characterized in that the space bounded by the outer face of the spacing cylinder and the faces of the contact members on the inner side of the spacing cylinder is formed so that, viewed from the outer face of the spacing cylinder operating as an out-coupling opening, said faces form an impedance transformer and a cavity resonator respectively, the electrical length of the impedance transformer being approximately one quarter of the wavelength associated with the resonance frequency of the cavity resonator with the impedances therein.

An additional advantage is that the junction resistances between the contact members and waveguide structure accommodating the microwave device are not located inside the cavity resonator of the microwave device so that these resistances are not included in the circuit of the high-frequency currents of the cavity resonator, the device being thus capable of providing a higher high-frequency power.

The invention will be described more fully with reference to the embodiments shown in the Figures. Corresponding parts in the various Figures are designated by the same references.

Figure 6A:
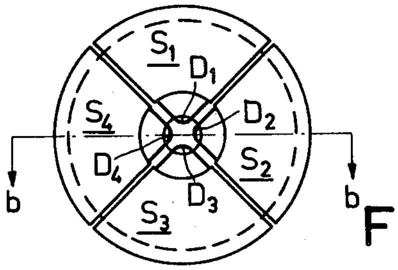
Figure 6B:
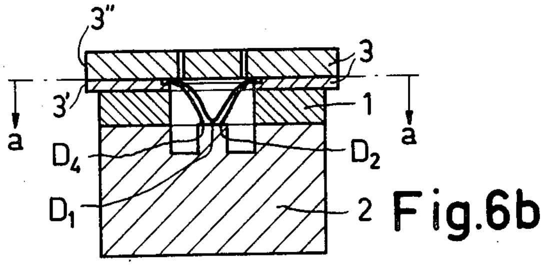

FIGS. 6*a* and 6*b* show an embodiment of a microwave device comprising a plurality of diodes.

Figure 7:
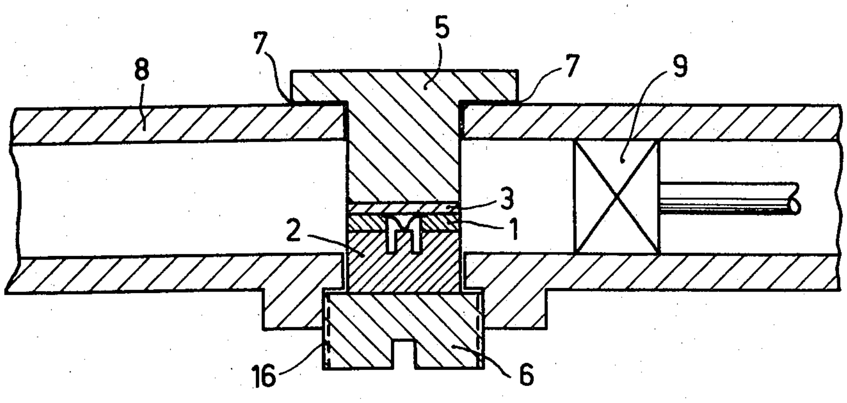
Figure 8:
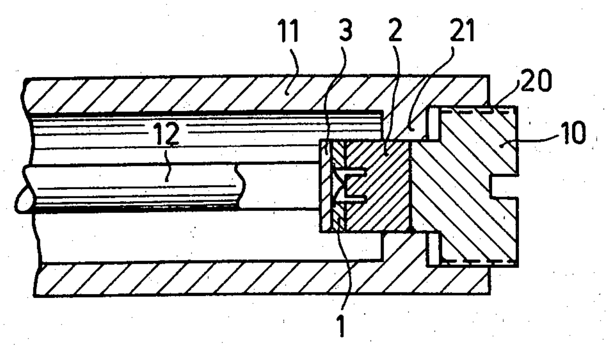

FIGS. 7 and 8 show embodiments of the microwave device arranged in waveguide structures.

Figure 1:
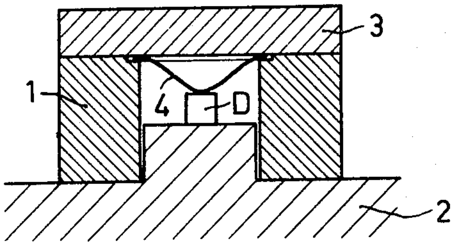
FIG. 1 shows a known diode envelope with a semiconductor diode.

The known diode envelope shown in FIG. 1 comprising a semiconductor diode D comprises a hollow, ceramic spacing cylinder 1, which is closed at one end by a contact member 2, to which one side of the diode D is directly connected. This contact member 2 operates on the one hand as a first electric connecting terminal of the diode and on the other hand as a heat-conducting element for conducting away the heat developed in the diode. The diode D is connected by its other end to approximately the center of a supply wire 4, the ends of which are connected to a disc-shaped contact member 3, which closes the spacing cylinder on the other side and which serves as a second electric connecting terminal for the diode D. This semiconductor diode with the envelope is arranged, in order to form an oscillator, in a cavity resonator which is provided with an impedance transformer constructed in the form of an iris diaphragm in order to match the load connected to the cavity resonator. The capacitance of the ceramic spacing cylinder is minimized and it is 0.14 pF. This capacitance is, however, in parallel with the series combination of the diode impedance and the supply wire and is partly determinative of the high-frequency impedance of the diode, which affects on the one hand the resonance frequency of the whole system and renders more difficult on the other hand matching the diode with the envelope to the cavity resonator and the external load.

Moreover, the high-frequency currents traverse the junction resistances of the connections of the contact members 2 and 3 to the cavity resonator, which brings about loss of high-frequency power.

Figure 2:
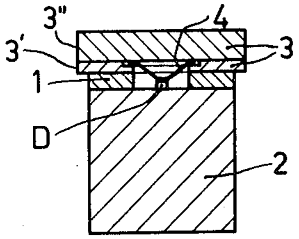
FIGS. 2, 3, 4 and 5 show embodiments of microwave devices embodying the invention.

The microwave device in accordance with the invention shown in FIG. 2 tends to obviate these disadvantages by a new configuration by arranging the cavity resonator and the matching transformer in the diode envelope, which, as compared with the diode envelope shown in FIG. 1, is not more complicated and scarcely more expensive.

Hereinafter only those parts will be described for the embodiment shown in FIG. 2 which differ from those of the embodiment of FIG. 1.

The hollow spacing cylinder 1 of FIG. 2 is made of a dielectric material having a high dielectric constant, for example, $\epsilon = 10$. The contact member 2 is formed by a solid cylinder having a diameter equal to the outer diameter of the spacing cylinder 1, for example, 8 mms. The contact member 3 is formed by a flat ring 3′ and a disc 3″. The ring 3′ has an inner diameter equal to that of the spacing cylinder 1, for example, 3 mms and is connected with the latter on one side. The outer diameters of the flat ring 3′ and of the disc 3″ are equal to each other and slightly larger than the diameter of the spacing cylinder 1. On the side of contact between the flat ring 3′ and the disc 3″ the inner diameter of the ring 3′ is slightly larger over a small height part than for the remaining part of the height so that a rim is obtained to which the ends of the supply wire are fastened.

Figure 3:
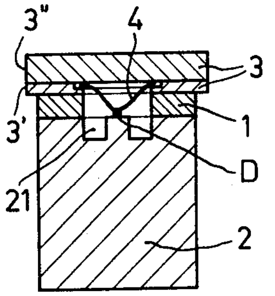

The resonance frequency of the reactive impedance of the diode, the supply wire and the space bounded by the inner face of the spacing cylinder and the contact members is about 10 GHz. The electrical radial length of the spacing cylinder with the dimensions given above by way of example is about one quarter of the wavelength associated with said resonance frequency and the assembly operates as a ¼-λ transformer which matches the impedance of the cavity resonator inner space bounded by the inner face of the spacing cylinder and the contact members, said impedances being about 1 to 2 Ohms, to the impedance of the waveguide configuration connected to the outer face of the spacing cylinder, said impedance being of the order of 50 to 400 Ohms. The capacitance of the spacing cylinder lies beyond the space bounded by the inner face of the spacing cylinder and the contact members, which space together with the reactive impedance of the diode D and of the supply wire 4 is in resonance. As a consequence this capacitance does no longer play any part in the resonance frequency or in the impedance, viewed from the diode, which facilitates matching of the impedance of the resonant space to that of the diode. A microwave device having a different resonance frequency can be obtained, as is shown in the embodiment of FIG. 3, by providing the contact member 2 with an annular channel 21 so that a different inductance of the space bounded by the inner face of the spacing cylinder 1 and the contact members 2 and 3 is obtained. It is furthermore possible to change all dimensions or to omit one half of the supply wire 4 so that the inductance of this wire is almost doubled.

Figure 4:
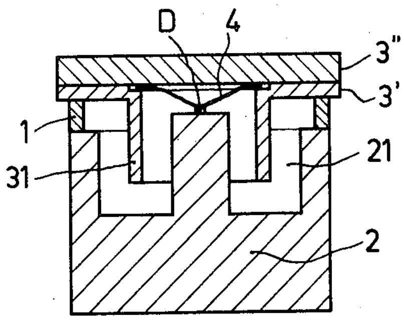

The ¼-λ transformer may be constructed in a different way, an example of which is given in FIG. 4.

Figure 5:
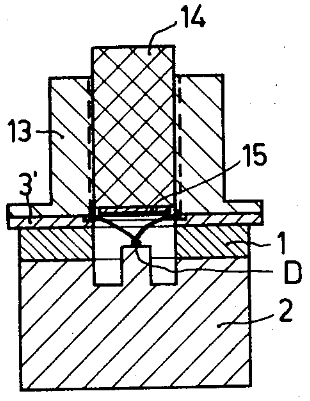

The solid cylinder 2 of this embodiment is provided with a circular channel 21 centrally arranged in the cylinder end connected to the diode D, whilst the flat disc 3' is provided with a hollow, upright cylinder 31, co-operating with the channel and having a height which is smaller than the height of the spacing cylinder 1 and the depth of the channel 21, the outer diameter thereof being smaller than the largest diameter of the channel and the inner diameter of the channel. In this way a labyrinth is formed, which forms, together with the spacing cylinder 1, the ¼-λ transformer. The microwave device may be rendered easily tunable, an example of which is shown in FIG. 5. It differs from the embodiment shown in FIG. 3 only in that the disc 3'' of FIG. 3 is replaced by a metal cylinder 13, which has an internally threaded axial bore, the diameter of which is equal to the inner diameter of the spacing cylinder 1. This bore holds a dielectric cylinder 14 having external screwthread. The end of this cylinder projecting inwardly is provided with a conductive metal layer 15. By turning the dielectric cylinder is moved up and down so that the inner space of the microwave device is varied and hence also the resonance frequency of said device is varied.

In order to obtain higher power a plurality of diodes may be arranged between the contact members 2 and 3. This involves the difficulty that the break-down voltages of the diodes are not equal to each other.

The embodiments of FIGS. 6a and 6b obviate this difficulty. This microwave device comprises four semiconductor diodes $D_1$ to $D_4$. The flat ring 3' and the disc 3'' are divided by two orthogonal sawcuts into four identical sectors $S_1$ to $S_4$.

To each of these sectors are connected only the two ends of the supply wire 4 of one of the diodes $D_1$ to $D_4$.

By the division into sectors each of the diodes can be connected to its own supply voltage source (not shown), which may be adjusted to the voltage desired for the diode. In order to couple the diodes with each other, the supply wires 4 of the diodes D of adjacent sectors are arranged near and parallel to each other over a large part of their length.

It should be noted that the frequency of this microwave device can be electrically controlled by using one of the semiconductor diodes as a variable capacitance.

FIG. 7 shows an embodiment of a rectangular waveguide comprising a microwave device in accordance with the invention. The wide sides of the wave guide 8 are for this purpose provided each with a bore lying opposite the other. The bore in one of the faces is filled with a solid cylinder 5 held therein tightly by an intermediate insulating layer 7, said cylinder having a widened end which ensures, when the cylinder 5 is inserted, that it penetrates into the waveguide only over a given depth. Via a low bandpass filter this cylinder 5 has connected to it a terminal of the supply source (not shown), the other terminal of which is connected to the waveguide. The other bore has internal screwthread 16 for receiving a solid cylinder 6 having external screwthread. The microwave device embodying the invention is arranged between the proximal end faces of the cylinders 5 and 6. The piston 9 is adjusted so that maximum power is transferred to the load. When the microwave device is exchanged it is only necessary to screw the cylinder 6 outwardly and inwardly and if a microwave device having a different resonance frequency is chosen only the piston 9 need be adjusted separately.

FIG. 8 shows an embodiment of a microwave device in accordance with the invention arranged in a coaxial waveguide. The end of the external conductors 11 of the coaxial waveguide has internal screwthread 20 for receiving a solid cylinder 10 having external screwthread. The external conductor 11 is provided on the inner side with an inwardly directed, rotation-symmetrical bolt 21 leaving a hole for accommodating the microwave device embodying the invention. This device is arranged between the end of the inner conductor 12 and the solid cylinder 10. The supply voltage source (not shown) is connected via a low bandpass filter between the inner and outer conductors of the coaxial cable. In the embodiments shown in FIGS. 7 and 8 the transitional resistances between the cylinders 3 and 5, between 2 and 6 and between 3 and the inner conductor 12 and between 2 and 10 are less important because they are not included in the resonance circuit of the device. From this Figure it will be apparent that the microwave device can be readily exchanged, which provides many possibilities of use.

What is claimed is:

1. A microwave oscillator comprising a hollow cylinder having a wall of dielectric material, a pair of conductive contact members closing the ends of said hollow cylinder, a semiconductor diode positioned within said hollow cylinder and having one terminal of said diode contacting one of said conductive contact members, a supply wire connecting the other terminal of said semiconductor diode to the second contact member, said cylinder and contact members cooperating to form a cavity resonator, said cylinder wall having a dielectric constant and a thickness to form an impedance transformer for matching the cavity resonator to an external load, the electrical length of said impedance transformer being substantially one quarter of the wavelength of the resonant frequency of the cavity resonator.

2. A microwave oscillator as claimed in claim 1 wherein said hollow cylinder forms the impedance transformer.

3. A microwave oscillator as claimed in claim 1 wherein the internal faces of the contact members lying within the hollow cylinder are provided with annular recesses to change the resonant frequency of the cavity resonator.

4. A microwave oscillator as claimed in claim 1 further comprising mechanical means for tuning said cavity resonator.

5. A microwave oscillator comprising a hollow cylinder of dielectric material, a pair of contact members for closing the ends of said hollow cylinder, one of said contact members being entirely conductive and the other being divided into conductive sections insulated from each other, a plurality of semiconductor diodes positioned within said hollow cylinder, one terminal of said diodes contacting said entirely conductive contact member, the number of sections of said contact member having insulated conductive sections corresponding to the number of said diodes, a plurality of supply wires for connecting said diodes to said contact member having insulated conductive sections, each supply wire connecting the second terminal of said diodes to one section of said contact member having insulated conductive sections, said cylinder, contact members, and supply wires cooperating to form a plurality of cavity resonators having an impedance transformer for matching said cavity resonators to an external load, the electrical length of the impedance transformer being substantially one quarter of the wavelength of the resonant frequency of each cavity resonator.

6. A microwave oscillator as claimed in claim 5 wherein said supply wires are connected so that the supply wires leading to adjacent sectors are located near each other and extend parallel to each other over a large part of their length.

7. A microwave oscillator as claimed in claim 5 wherein said plurality of semiconductor diodes comprise at least one diode having a voltage variable capacitance.

* * * * *